United States Patent [19]
Bertolet et al.

[11] Patent Number: 5,389,836
[45] Date of Patent: Feb. 14, 1995

[54] BRANCH ISOLATION CIRCUIT FOR CASCODE VOLTAGE SWITCH LOGIC

[75] Inventors: Allan R. Bertolet, Williston; Albert M. Chu, Essex Junction; William R. Griffin, Shelburne; John G. Petrovick, Jr., Colchester; Larry Wissel, Williston, all of Vt.

[73] Assignee: International Business Machines Corporation, Armonk, N.Y.

[21] Appl. No.: 72,276

[22] Filed: Jun. 4, 1993

[51] Int. Cl.[6] .................. H03K 19/096; H03K 19/20; H03K 19/017
[52] U.S. Cl. .................... 326/110; 326/98; 326/21; 327/433
[58] Field of Search ............... 307/446, 452, 443, 570, 307/583

[56] References Cited

U.S. PATENT DOCUMENTS

| | | | |
|---|---|---|---|
| 4,570,084 | 2/1986 | Griffin et al. | 307/452 |
| 4,607,339 | 8/1986 | Davis | 364/491 |
| 4,608,649 | 8/1986 | Davis et al. | 364/491 |
| 4,656,417 | 4/1987 | Kirkpatrick et al. | 324/73 R |
| 4,659,947 | 4/1987 | Ogura et al. | 307/446 |
| 4,686,392 | 8/1987 | Lo | 307/448 |
| 4,698,830 | 10/1987 | Barzilai et al. | 377/19 |
| 4,700,086 | 10/1987 | Ling et al. | 307/443 |
| 4,730,133 | 3/1988 | Yoshida | 307/452 |
| 4,797,580 | 1/1989 | Sunter | 307/443 |
| 4,798,979 | 1/1989 | Lee et al. | 307/446 |
| 4,935,646 | 6/1990 | Peterson, Jr. et al. | 307/443 |

FOREIGN PATENT DOCUMENTS

WO89/05547 6/1989 WIPO.

OTHER PUBLICATIONS

"Improved Multi-Emitter BICMOS Logic Circuit," Research Disclosure, Number 311, Kenneth Mason Publications Ltd., England, Mar. 1990.

Primary Examiner—Edward P. Westin
Assistant Examiner—Benjamin D. Driscoll
Attorney, Agent, or Firm—Heslin & Rothenberg

[57] ABSTRACT

Cascode voltage switch (CVS) logic circuits include a CMOS logic tree having multiple logic branches and a bipolar, branch isolation transistor. Each logic branch of the logic tree changes state between a logic "1" and a logic "0", with a state change being manifested as a charging or discharging of the logic branch. The bipolar transistor comprises a multiple-emitter bipolar transistor wherein each emitter is electrically coupled to a different logic branch of the CMOS logic tree. A precharge circuit, coupled to the logic tree via the bipolar transistor, provides charge to an output of the CVS circuit prior to operation of said logic tree. The logic branches of the logic tree are charged and discharged substantially independently of one another thereby enhancing speed of the combinatorial logic circuit. Various circuit modifications and generalizations are also discussed.

16 Claims, 4 Drawing Sheets ical logic systems and, more particularly, to a branch isolation circuit for isolating, for example, the branches of a cascode voltage switch (CVS) logic system.

BRANCH ISOLATION CIRCUIT FOR CASCODE VOLTAGE SWITCH LOGIC

TECHNICAL FIELD

The present invention relates in general to combinatorial logic systems and, more particularly, to a branch isolation circuit for isolating, for example, the branches of a cascode voltage switch (CVS) logic system.

BACKGROUND ART

Single-ended cascode voltage switch logic and differential cascode voltage switch logic have been extensively discussed in the open literature (see, for example, Carter et al "Cascode Parity Circuit," IBM Technical Disclosure Bulletin, Vol. 24, No. 3, Aug. 1981, pp. 1705–1706; and Hiltebeitel "CMOS XOR," IBM Technical Disclosure Bulletin, Vol 24, No. 11A, Apr. 1982, pp. 5470–5471). Briefly, a typical CVS circuit is partitioned into any number of basic building blocks called logic modules, each including a logic tree, an associated buffer and a precharge circuit. The buffer and precharge circuits are generally identical but the internal structure of the logic trees may be different depending upon which logic function a logic tree is designed to implement.

In a conventional cascode voltage switch circuit, the switching of any single branch within the logic tree results in discharging of the internal node capacitances of all other branches. This "additional" discharging reduces the switching speed of the circuit and limits the number of logic branches within the tree (i.e., the discharging worsens as the "width" of the logic tree increases).

Thus, a need exists for an enhanced cascode voltage switch circuit design wherein the various logic branches of the logic tree are isolated such that there is no unnecessary discharging of inactive branches. The present invention provides such a circuit design.

DISCLOSURE OF INVENTION

Briefly summarized, the invention comprises in one aspect a combinatorial logic circuit having a logic tree including multiple logic branches each of which changes state between a logic "1" and a logic "0", with each state change being manifested as a charging or discharging of the logic branch. An isolation circuit is electrically coupled to each logic branch of the logic tree for electrically isolating each of the multiple logic branches of the logic tree from all other logic branches of the tree. A precharge circuit is coupled to the logic tree via the isolation circuit to provide charge to an output of the combinatorial logic circuit prior to logic operation of the logic tree. The logic branches of the logic tree are charged and discharged substantially independently of one another, thereby enhancing switching speed of the combinatorial logic circuit. In one embodiment discussed, the logic tree comprises a CMOS CVS logic tree and the isolation circuit comprises a multiple-emitter bipolar transistor.

In an enhanced aspect, the invention comprises a BiCMOS combinatorial logic circuit having a CMOS logic tree with multiple logic branches, each of which changes state between a logic "1" and a logic "0". Each logic branch is coupled to a first potential and has at least one field-effect transistor of a first conductivity type. A bipolar transistor is provided for electrically isolating each logic branch of the logic tree from all other logic branches. The bipolar transistor includes a collector of the first conductivity type connected to a circuit output line, along with multiple emitters of the first conductivity type (each of which is coupled to a different logic branch of the logic tree) and a base of a second conductivity type. A precharge circuit is coupled to the logic tree via the bipolar transistor. The precharge circuit provides charge to the circuit output prior to operation of the logic tree. The logic branches of the logic tree are charged and discharged substantially independently of one another thereby enhancing switching speed of the BiCMOS combinatorial logic circuit. Additional circuit modifications, along with circuit generalizations, are provided herein.

In all embodiments, the present invention comprises a novel combinatorial logic circuit wherein a single logic branch of a multiple branch logic tree can be switched independently of all other branches of the logic tree, thereby avoiding discharging of internal node capacitances of the other branches. By avoiding additional discharging, switching speed of the circuit is improved (without reducing circuit capacitance) and prior art restrictions on the number of logic branches within the logic tree are removed. Disclosed is a generalized circuit technique which can be applied to either a clocked or static BiCMOS logic family. Furthermore, the circuit technique can be applied to differential cascode voltage switch circuits as well as single-ended cascode voltage switch circuits. Switching speed is significantly improved in larger circuits.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which:

FIGS. 5a & 5b are schematics of static combinatorial logic circuits employing branch isolation pursuant to the present invention, FIG. 5b being the complement of FIG. 5a.

BEST MODE FOR CARRYING OUT THE INVENTION

Figure 1:
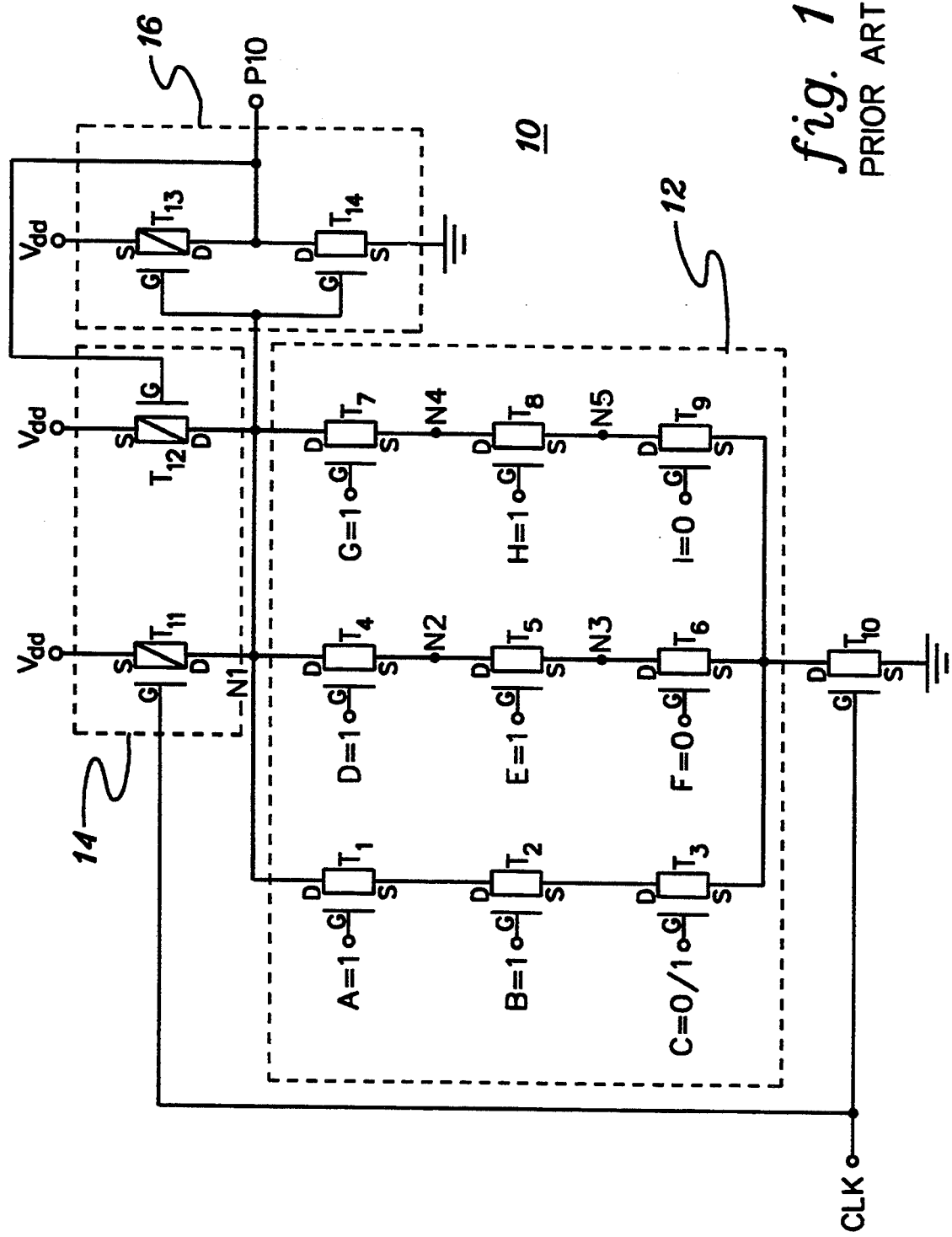
FIG. 1 is a schematic of a prior art 3×3 AND-OR CVS circuit.

As a state-of-the-art type example, a typical 3×3 AND-OR function is implemented in FIG. 1 using conventional CVS circuit technology. This circuit, generally denoted 10, includes a 3×3 logic tree 12, a precharge circuit 14 and a buffer 16, all of which are connected together as shown. The circuit utilizes complementary metal oxide semiconductor (CMOS) circuits with P-channel field-effect transistors (PFETs), each of which is indicated in the drawings by a rectangle with a diagonal line formed therein and a control element or gate electrode arranged adjacent thereto, and with N-channel field-effect transistors (NFETs), indicated by a rectangle without a diagonal line and with a control element or gate electrode arranged adjacent thereto.

Referring first to logic tree 12, a 3×3 array of NFETs $T_1$-$T_9$ is presented. Each NFET is driven by a different input signal, i.e., signals A, B, C, D, E, F, G, H & I. (The particular gate "G" values are discussed below.) NFETs $T_1$, $T_2$ & $T_3$ are tied together such that NFET $T_1$ has its source "S" tied to the drain "D" of NFET $T_2$ which has its source "S" tied to the drain "D" of NFET $T_3$. The sources and drains of NFETs $T_4$-$T_6$ and $T_7$-$T_9$ in the remaining branches of logic tree 12 are similarly serially connected. Nodes N2 and N3 are identified between NFETs $T_4$ & $T_5$ and NFETS $T_5$ & $T_6$, respectively. Similarly, nodes N4 and N5 are identified between NFETS $T_7$ & $T_8$ and NFETS $T_8$ & $T_9$, respectively. Logic tree 12 is coupled to ground potential via NFET $T_{10}$, which is gated "G" by a clock signal CLK.

A node N1 feeds each branch of logic tree 12 and an output line P10, via buffer 16. Precharge circuit 14 precharges node N1 prior to gating of the respective NFETs of logic tree 12. Precharge circuit 14 includes two PFETs, namely $T_{11}$ & $T_{12}$. PFET $T_{11}$ is gated "G" by system clock "CLK", while PFET $T_{12}$ is gated "G" by the signal on output line P10. The source "S" of each PFET $T_{11}$ and $T_{12}$ is tied to chip voltage $V_{dd}$, while the drains "D" of PFETs $T_{11}$ and $T_{12}$ are connected to node N1. The signal at node N1 also controls PFET $T_{13}$ and NFET $T_{14}$, which together comprise buffer 16. PFET $T_{13}$ is supplied by chip voltage $V_{dd}$, while its drain "D" is coupled to the drain "D" of NFET $T_{14}$. NFET $T_{14}$ has its source "S" tied to ground. The signal at the coupled drains "D" comprises output signal P10 from circuit 10.

In operation, clock signal CLK is assumed to be initially low, turning "on" transistor $T_{11}$ and turning "off" transistor $T_{10}$. Node N1 is precharged high and output node P10 is low. In this state, the circuit is said to be in precharge mode. The inputs (A through I) are outputs from other CVS circuits that are precharged low. When the system clock signal CLK goes high, the circuit switches to evaluation mode and depending upon the state of the input signals (A through I), the circuit output will either stay low or switch to a high state.

For a worst case delay scenario, it is assumed that input C is switched from a logic "0" to a logic "1" after the other inputs have reached the states shown in FIG. 1. With such input signals, transistors $T_1$, $T_2$, $T_4$, $T_5$, $T_7$ and $T_8$ are "on", while transistors $T_3$, $T_6$ and $T_9$ are "off". As input C goes from logic "0" to logic "1", NFET $T_3$ turns "on" and forms a current path to discharge node N1 to ground via NFET $T_{10}$, through the logic tree branch defined by NFETs $T_1$, $T_2$ and $T_3$. Additionally, the parasitic capacitances at nodes N2, N3, N4 and N5 are also discharged since transistors $T_4$, $T_5$, $T_7$ and $T_8$ are "on". This additional discharging degrades switching speed of the circuit and worsens as the "width" of the logic tree increases. A novel cascode voltage switch circuit pursuant to the present invention eliminates this source of performance degradation.

In one embodiment of the present invention (shown in FIG. 2), a multiple-emitter bipolar transistor is provided to isolate the branches of the CVS logic tree and thereby improve circuit switching speed. Such an improved cascode voltage switch circuit (denoted 20 in FIG. 2) includes a CVS logic tree 22, a precharge circuit 24 and an output buffer 26. CVS logic tree 22 has multiple control inputs A, B ... X and multiple logic branches 1, 2, ... n. The underlying concept of the present invention is implemented (in this embodiment) by disposing an isolation circuit between the various branches of CVS logic tree 22 such that discharging through one branch will not affect charge stored on any other branch of the logic tree. This is accomplished in the circuit presented by use of a multiple-emitter bipolar transistor 28 wherein each branch of the CVS logic tree is coupled to a different emitter "E". The collector "C" of bipolar transistor 28 is connected to precharge circuit 24 and the base "B" is controlled by a biasing circuit 30, which itself is gated by system clock signal CLK. (The biasing circuit 30 for the bipolar device can be constructed using any known biasing circuit technique.)

Figure 2:
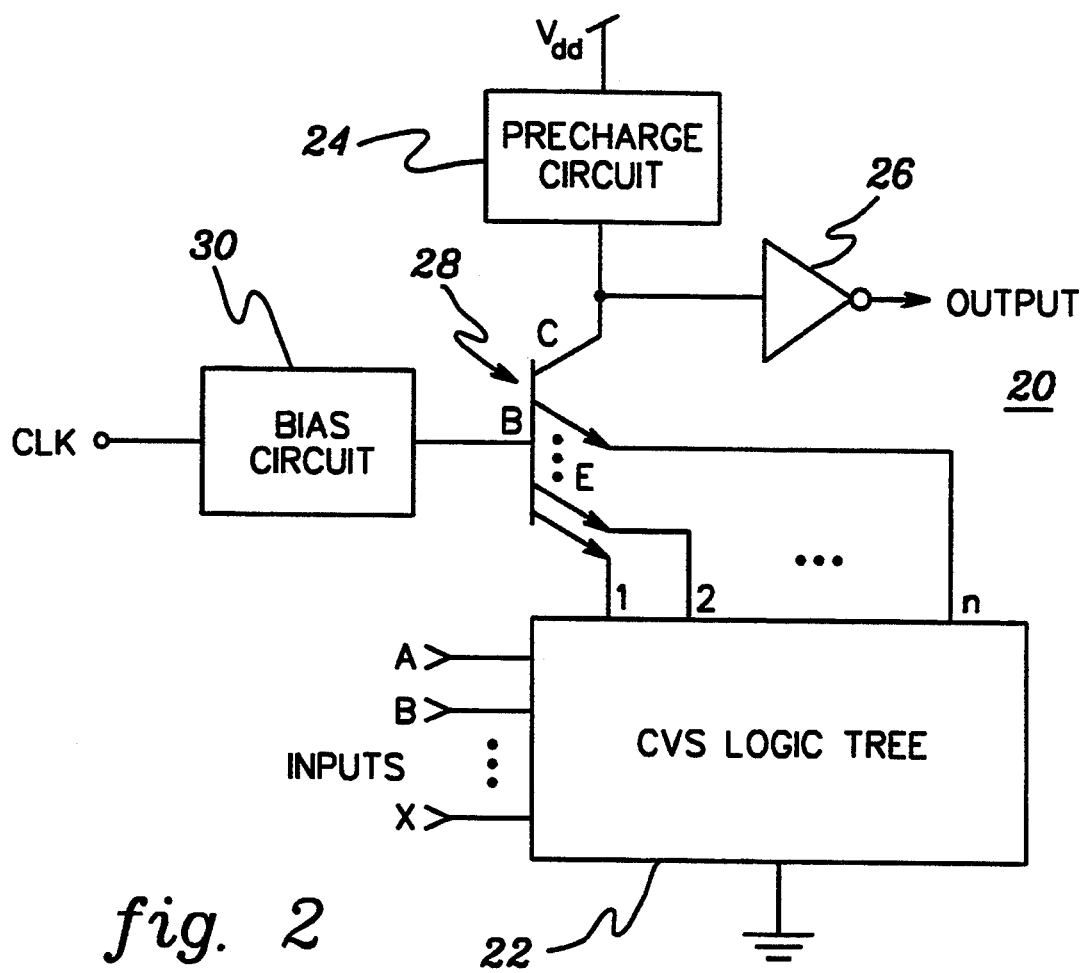
FIG. 2 is a generalized schematic of a CVS circuit pursuant to the present invention.
Figure 3:
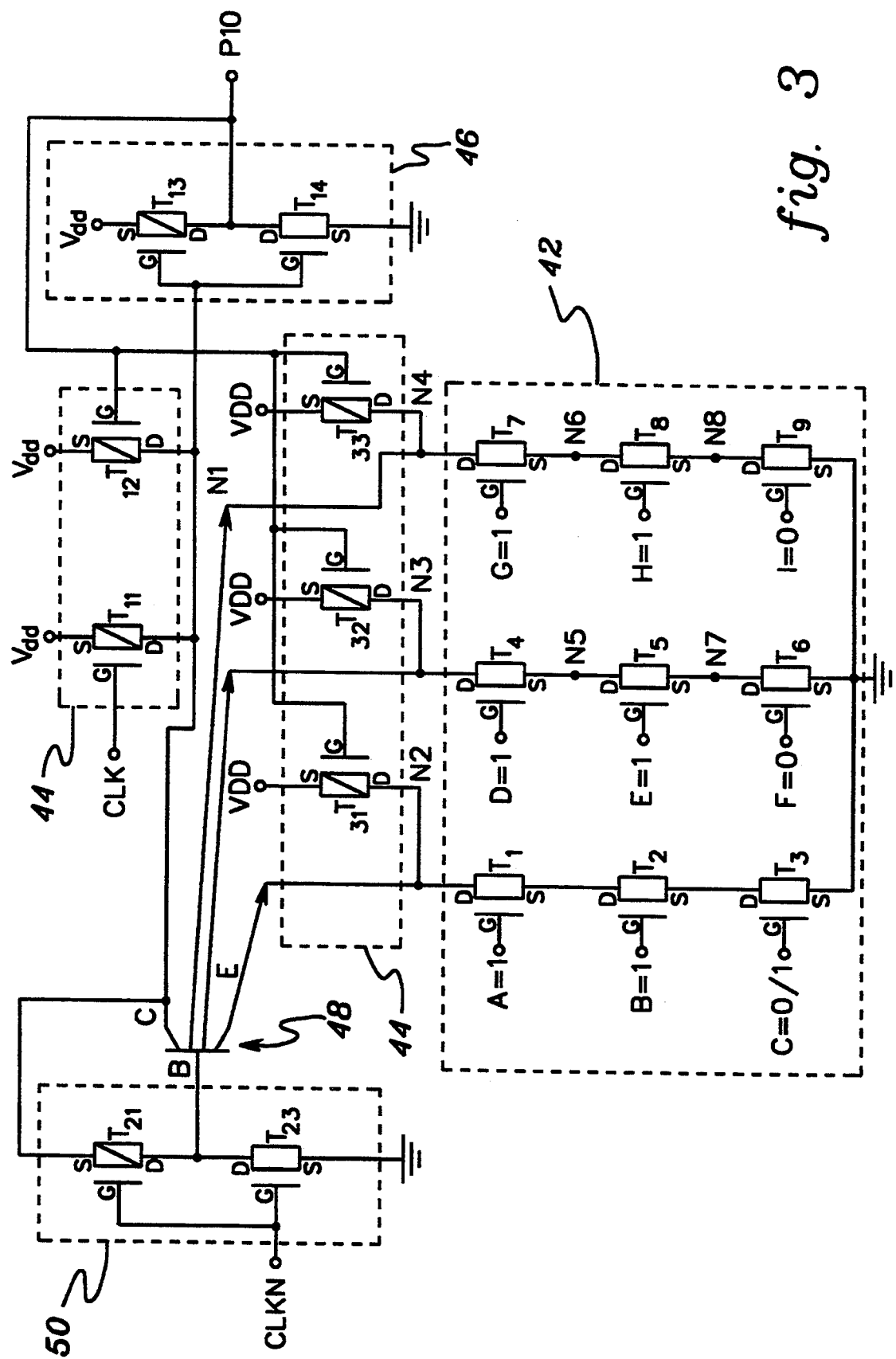
FIG. 3 is a schematic of a 3×3 AND-OR BiCMOS CVS circuit pursuant to the present invention.

By way of further example, a 3×3 AND-OR BiCMOS CVS circuit, denoted 40, having the form of circuit 20 of FIG. 2 is shown in FIG. 3. In this figure, the CVS logic tree 42 and output buffer 46 are substantially identical to logic tree 12 and buffer 16, respectively, of FIG. 1. (One exception is that the interconnecting nodes between NFETs in two of the three logic branches are renumbered.) A precharge circuit 44 is expanded to include at the input to each logic tree branch a corresponding NFET $T_{31}$, $T_{32}$ & $T_{33}$, each of which has its source "S" tied to chip voltage $V_{dd}$ and drain "D" tied to the input node N2, N3 and N4 of its respective logic tree branch. These transistors are gated "G" by the signal at output terminal P10. In this example, a bipolar transistor 48 comprises an NPN-type transistor which has its collector "C" tied to node N1 and base "B" tied to a bias circuit 50. Each emitter "E" of multi-emitter bipolar transistor 48 is tied to a separate branch of logic tree 42. Circuit 50 includes a PFET $T_{21}$ and an NFET $T_{23}$ connected in series between node N1 and ground potential. These transistors form the control circuit to turn on/off bipolar device 48. Transistors $T_{21}$ and $T_{23}$ are clocked by the complement signal CLKN to system clock CLK.

In operation, the system clock CLK is assumed to be initially low, thereby turning "on" transistor $T_{11}$, which precharges node N1 high. Complementary clock signal CLKN (i.e., the inversion of CLK) is high, thus turning "off" PFET $T_{21}$ and NFET $T_{23}$, which holds the base "B" of bipolar transistor 48 low. Transistor $T_{12}$ holds node N1 high during precharge mode to avoid any output glitches. In addition, transistors $T_{31}$, $T_{32}$, $T_{33}$ precharge each branch of the CVS logic tree 42. Since the inputs to this circuit originate as outputs of similar CVS circuits (which are precharged low) all the inputs are initially low.

When input clock CLK goes high (and clock CLKN simultaneously goes low) transistor $T_{21}$ turns "on" forming a current path from node N1 to the base "B" of bipolar transistor 48. Transistor 48 is then ready to conduct current as soon as one of the nodes N2, N3 or N4 goes low. When one of these nodes goes low, the bipolar transistor is turned "on" and node N1 is discharged through the device. Nodes N3 and N4 remain high since NFETs $T_6$ and $T_9$ are "off". The bipolar transistor blocks the flow of current from node N3 or N4 to node N1. Therefore, switching of the CVS logic tree requires only the discharge of the particular switching branch capacitor and common node N1. This significantly improves switching speed of the cascode voltage switch circuit, especially with large "width" CVS logic trees.

The delay of a 3×3 BiCMOS CVS circuit is comparable to that of a conventional CVS circuit. However, as the number of branches increase, the BiCMOS CVS circuit delay according to the present invention does not increase much, while the conventional CVS circuit delay does. For example, a 3×4 AND-OR circuit implemented using a BiCMOS CVS technique pursuant to the present invention is approximately ten percent faster than a conventional CVS circuit. This performance leverage increases as the number of branches increase in the CVS tree. Therefore, to take full advantage of the BiCMOS CVS concept of the present invention, logic trees with more branches should be employed.

Figure 4:
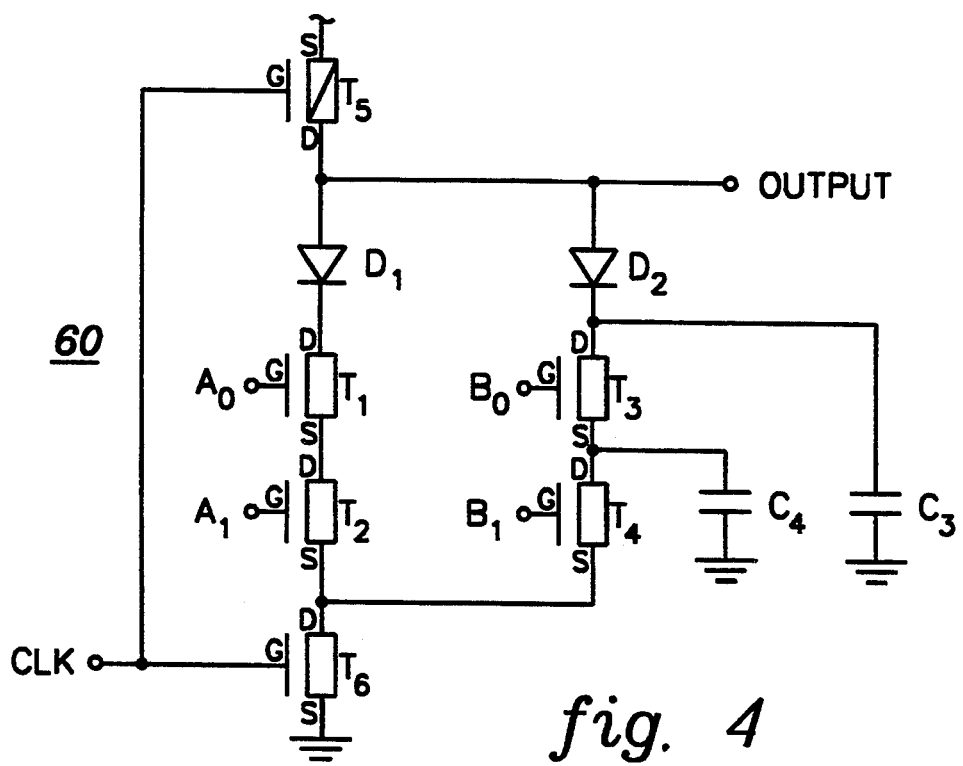
FIG. 4 is a schematic of an alternate embodiment of a clocked combinational logic circuit pursuant to the present invention.

FIG. 4 depicts another embodiment of the present invention wherein a conventional CMOS-only CVS circuit, denoted 60, is enhanced by the addition of isolation diodes $D_1$ and $D_2$. During fabrication, the additional diffusion layers required to implement diodes $D_1$ and $D_2$ can be readily achieved employing existing BiCMOS processing.

A first one of two parallel branches within circuit 60 includes two NFETs $T_1$ & $T_2$ connected in series, while a second branch of the logic consists of NFET $T_3$ & NFET $T_4$, also connected in series. Circuit 60 is clocked by a clock signal CLK input to the gates "G" of a charge PFET $T_5$ and a drain NFET $T_6$ as shown. Pursuant to the invention, isolation diodes $D_1$ and $D_2$ are placed in series with a different one of the logic branches comprising the parallel branches of logic circuit 60. A first capacitor $C_3$ is disposed between diode $D_2$ and NFET $T_3$, and a second capacitor $C_4$ is connected between NFET $T_3$ and NFET $T_4$. Capacitors $C_3$ and $C_4$ are representative of parasitic capacitances typically occurring at these nodes.

In operation, diodes $D_1$ and $D_2$ serve to isolate capacitances from the switching nodes. For example, if input $A_0$ is "1", input $A_1$ is "1", input $B_0$ is "1" and input $B_1$ is "0", then when the clock signal CLK becomes active (switches to "1"), the path through series connected devices $T_1$ and $T_2$ will conduct thereby causing the output to switch, while the path through series connected devices $T_3$ and $T_4$ will not conduct. In such a case, parasitic capacitances $C_3$ and $C_4$ would normally slow down the circuit transition, while in the present embodiment diode $D_2$ electrically isolates these capacitances $C_3$ and $C_4$ from the switching node, thereby allowing a faster transition.

Figure 5A:
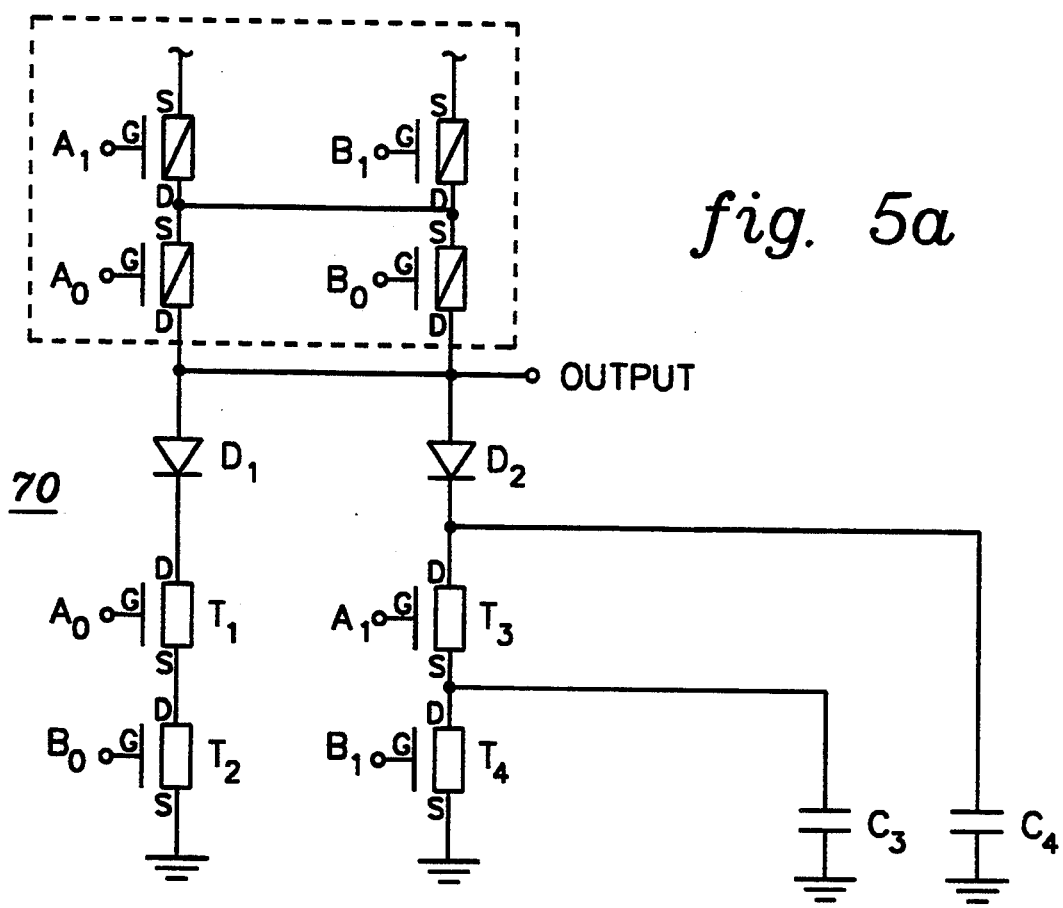
Figure 5B:
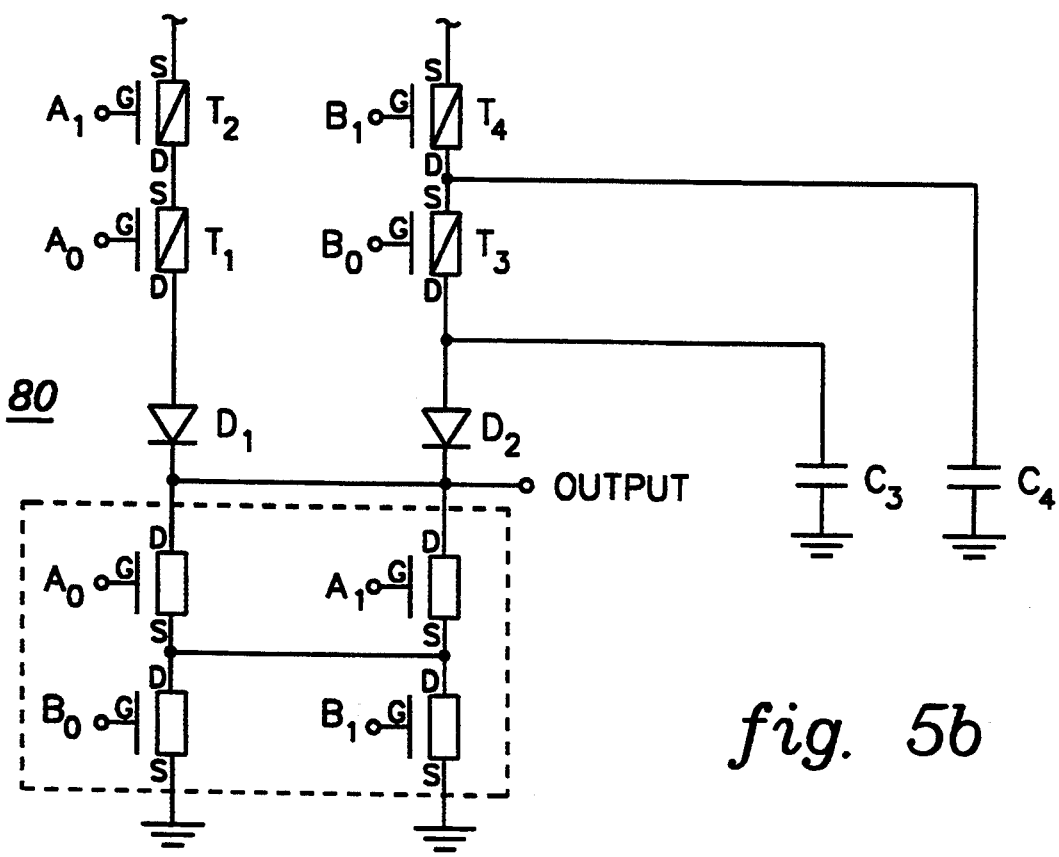

The branch isolation concepts presented herein can be generalized to static CMOS circuits, such as those shown in FIGS. 5a & 5b. (FIG. 5b is the complement to FIG. 5a.) These circuits, denoted 70 & 80, comprise static logic which during VLSI fabrication would contain a level of processing complexity representative of a BiCMOS implementation. In both embodiments, the conventional static CMOS circuit is improved through the addition of isolation diodes $D_1$ and $D_2$. (The additional diffusion layers required to implement these diodes can be achieved readily with BiCMOS processing.) The number of isolation diodes will equal the number of parallel branches occurring within the particular logic circuit.

In FIG. 5a, diodes $D_1$ and $D_2$ serve to isolate parasitic capacitances, such as capacitances $C_3$ and $C_4$, from the switching nodes. As with the example of FIG. 4, if input $A_0$ is "1", input $A_1$ is "1", input $B_0$ is "1" and input $B_1$ is "0", then the path through series connected devices $T_1$ and $T_2$ conducts to pull OUTPUT low, while the path through series connected devices $T_3$ and $T_4$ does not conduct. Parasitic capacitances $C_3$ and $C_4$ would impede circuit transition in a conventional static CMOS circuit, while in the circuit depicted, diode $D_2$ electrically isolates these capacitances from the switching node, thereby allowing a faster transition to occur.

The operation of circuit 80 of FIG. 5b is analogous to that of circuit 70 of FIG. 5a. In the FIG. 5b embodiment, diodes $D_1$ and $D_2$ again serve the purpose to isolate capacitances from the switching nodes. For example, if input $A_0$ is "0", input $A_1$ is "0", input $B_0$ is "0", and input $B_1$ is "1", then the path through series connected devices $T_1$ and $T_2$ conducts to pull the output high, while the path through series connected devices $T_3$ and $T_4$ does not conduct. Parasitic capacitances $C_3$ and $C_4$ do not impede circuit transition because diode $D_2$ functions to electrically isolate capacitances $C_3$ and $C_4$ from the switching node.

In all embodiments, the present invention comprises a novel combinatorial logic circuit wherein a single logic branch of a multiple branch logic tree can be switched independently of all other branches of the logic tree, thereby avoiding discharging of internal node capacitances of all other branches. By avoiding the additional discharging, switching speed of the circuit is improved and prior art restrictions on the number of logic branches within the logic tree are removed. Disclosed is a generalized circuit technique which can be applied to a BiCMOS logic family. Furthermore, the circuit technique can be applied to differential cascode voltage switch circuits as well as to single-ended cascode voltage switch circuits. Switching speed is significantly improved in larger circuits.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A combinatorial logic circuit comprising:
    a logic tree having multiple branches each of which changes state between a logic "1" and a logic "0", each state change within a logic branch manifesting itself as a charging or discharging of the logic branch, wherein state changes from a logic "1" to a logic "0" are characterized as a discharging of the logic branch and state changes from a logic "0" to a logic "1" are characterized as a charging of the logic branch, said logic branches being coupled together so as to form a single output;
    an isolation circuit electrically coupled to each logic branch of said logic tree for electrically isolating each logic branch from all logic branches of said logic tree; and
    a precharge circuit coupled to said logic tree via said isolation circuit for providing charge to said logic tree and to said output of said combinatorial logic circuit prior to operation of said logic tree, whereby the logic branches of said logic tree are charged and discharged substantially independently of one another thereby enhancing switching speed of the combinatorial logic circuit.

2. The combinatorial logic circuit of claim 1, wherein said logic tree comprises a cascode voltage switch (CVS) logic tree.

3. The combinatorial logic circuit of claim 2, wherein said CVS logic tree comprises a CMOS combinatorial logic circuit.

4. The combinatorial logic circuit of claim 3, wherein said isolation circuit comprises a bipolar transistor.

5. The combinatorial logic circuit of claim 4, wherein said bipolar transistor comprises a multiple-emitter bipolar transistor having a collector, a base and multiple emitters, and wherein each one of said multiple emitters is coupled to a respective one of said multiple logic branches of said logic tree.

6. The combinatorial logic switch of claim 4, further comprising a bias circuit connected to the base of said bipolar transistor for providing a bias current to said base in response to a clock signal.

7. The combinatorial logic circuit of claim 4, wherein said bipolar transistor comprises an NPN-type bipolar transistor.

8. The combinatorial logic circuit of claim 4, wherein said circuit comprises an AND-OR BiCMOS CVS circuit.

9. The combinatorial logic circuit of claim 3, wherein said isolation circuit comprises multiple isolation diodes, each one of said multiple isolation diodes being coupled to a respective one of said multiple logic branches of said logic tree.

10. A BiCMOS combinatorial logic circuit comprising:
   a CMOS logic tree having multiple logic branches each of which changes state between a logic "1" and a logic "0", each logic branch is coupled to a first potential and has at least one field-effect transistor of a first conductivity type;
   a bipolar transistor for electrically isolating each logic branch of the logic tree from all other logic branches, said bipolar transistor having a collector of the first conductivity type, connected to a circuit output line, multiple emitters of the first conductivity type, with each emitter being coupled to a different logic branch of said logic tree, and a base of a second conductivity type; and
   a precharge circuit coupled to said logic tree via said bipolar transistor, said precharge circuit providing charge to said circuit output prior to operation of said logic tree, whereby the logic branches of said logic tree are charged and discharged substantially independently of one another to enhance switching speed of the BiCMOS combinatorial logic circuit.

11. The BiCMOS combinatorial logic circuit of claim 10, wherein said precharge circuit is electrically coupled to and fed by a second potential.

12. The BiCMOS combinatorial logic circuit of claim 11, wherein said CMOS logic tree comprises a cascode voltage switch (CVS) logic tree.

13. The BiCMOS combinatorial logic circuit of claim 12, wherein said precharge circuit includes multiple field-effect transistors of said second conductivity type.

14. The BiCMOS combinatorial logic circuit of claim 13, wherein said bipolar transistor comprises an NPN-type transistor, said field-effect transistors of the first conductivity type comprise NFETs, and said field-effect transistors of the second conductivity type comprise PFETs, and wherein said first potential comprises ground potential and said second potential comprises a circuit supply voltage $V_{dd}$.

15. The BiCMOS combinatorial logic circuit of claim 14, further comprising a bias circuit connected to the base of said bipolar transistor for providing a bias current to said base in response to a clock signal.

16. The BiCMOS combinatorial logic circuit of claim 15, wherein said circuit comprises an AND-OR BiCMOS CVS circuit.

* * * * *